US008373493B2

(12) United States Patent
Chakrabarty et al.

(10) Patent No.: US 8,373,493 B2
(45) Date of Patent: Feb. 12, 2013

(54) POWER SWITCH DESIGN AND METHOD FOR REDUCING LEAKAGE POWER IN LOW-POWER INTEGRATED CIRCUITS

(75) Inventors: Krishnendu Chakrabarty, Chapel Hill, NC (US); Chrysovalantis Kavousianos, Ioannina (GR); Zhaobo Zhang, San Jose, CA (US)

(73) Assignee: Duke University, Durham, NC (US)

( * ) Notice: Subject to any disclaimer, the term of this patent is extended or adjusted under 35 U.S.C. 154(b) by 192 days.

(21) Appl. No.: 12/882,776

(22) Filed: Sep. 15, 2010

(65) Prior Publication Data
US 2012/0062308 A1 Mar. 15, 2012

(51) Int. Cl.
*H03K 17/687* (2006.01)
(52) U.S. Cl. .................. 327/427; 327/419; 327/404
(58) Field of Classification Search .................. None
See application file for complete search history.

(56) References Cited

U.S. PATENT DOCUMENTS

| 4,885,597 A * | 12/1989 | Tschang et al. ............ 347/237 |
| 7,716,609 B1 * | 5/2010 | Taheri ....................... 716/135 |
| 2004/0039953 A1 * | 2/2004 | Confalonieri et al. ..... 713/320 |
| 2006/0227927 A1 * | 10/2006 | Lee et al. ................... 377/82 |
| 2008/0129348 A1 * | 6/2008 | Shau .......................... 327/108 |
| 2009/0146988 A1 * | 6/2009 | Johnson et al. ............ 345/214 |

OTHER PUBLICATIONS

Singh, H., et al., "Enhanced Leakage Reduction Techniques Using Intermediate Strength Power Gating," 2007, IEEE Transactions on Very Large Scale Integration (VLSI) Systems, vol. 15, No. 11, pp. 1215-1224.

* cited by examiner

*Primary Examiner* — Cassandra Cox
(74) *Attorney, Agent, or Firm* — Saliwanchik, Lloyd & Eisenschenk

(57) ABSTRACT

Power switching circuits and power management techniques are provided that can reduce static power of ICs, including digital core processors. In one embodiment, the power switching circuit includes a footer (power-gating transistor) between the core and a ground rail and at least two additional power-gating transistors parallel to the footer. The power-gating transistors are controlled by respective control signals to enable selective switching. In a specific embodiment, for each sleep mode, at most, a single one of the transistors is turned on. Multiple sleep modes are accomplished according to the relative sizing of the additional power-gating transistors. A larger of the additional transistors is used to provide a standby mode during short idling times by providing a fast wake-up time and some reduction in static power. For standby modes during longer idling periods, smaller sized transistors are turned on. For longest idling periods, all transistors are turned off.

20 Claims, 5 Drawing Sheets

POWER SWITCH DESIGN AND METHOD FOR REDUCING LEAKAGE POWER IN LOW-POWER INTEGRATED CIRCUITS

This invention was made with government support under Grant No. CCF-0903392 awarded by the National Science Foundation. The U.S. Government has rights in this invention.

BACKGROUND

Off-state leakage, also referred to as static power, is the current that leaks through transistors even when they are turned off. Dynamic power, which arises from short circuit dissipation and the switching power consumed by the repeated charge and discharge of the load capacitances of the hundreds of millions of transistor gates in today's chips, has been a significant source of power consumption. However, as the semiconductor industry moves into the nanometer technologies, static power consumption elevates to unacceptable levels.

Indeed, static power consumption is a serious problem for electronic circuits fabricated using deep submicron technologies. A consequence of static power consumption is that an integrated circuit continues to "leak" power even if it is in standby mode. For portable devices such as cell phones, PDAs, and laptops, static power consumption needs to be reduced to prolong battery lifetime. Considering the wide range of applications offered by portable devices, as well as the huge market depending on these devices, the reduction of static power has been identified as a major goal for industry.

The exponential increase of the sub-threshold leakage current in the deep submicron technologies is a large contributor to the increased static power. The increased sub-threshold leakage current is caused by the reduction of the supply voltage, which consequently leads to the reduction of the threshold voltage ($V_{th}$) of the devices.

Many techniques have been presented for tackling the very high leakage power dissipated in these circuits. Some techniques try to reduce the leakage power during the active mode of the circuit operation while other techniques try to reduce the leakage power consumed during the periods of circuit inactivity.

In the first case, the circuit is typically partitioned into two regions: a high performance region and a low performance region. For the high performance region, which is used for performance-critical parts of the circuit, the cells contain low-threshold devices with high performance characteristics, but also high leakage power. For the low performance region, which is used in the high-slack parts of the design, the cells contain high-threshold devices with less leaky but also low-speed cells. By using the two types of cells, the overall (normal as well as standby mode) static power is reduced without any significant performance degradation.

In the second case, the target is to further reduce the leakage power during long periods of inactivity of the circuit operation. Many digital cores (e.g., processors) remain idle for long periods during their normal operation. For such cases, further improvements can be achieved using power gating techniques, which turn off the cores during long idle periods. By turning off the cores during long idle periods, the power consumed during these periods of inactivity is significantly reduced and may be almost eliminated. To turn off the cores, additional power-gating transistors are provided between the core under test and the power rail or the ground rail, which turn on and/or turn off the cores. By turning off the cores during idle periods, greater power savings can be accomplished at the circuit.

A typical power switch consists of a footer transistor connected between the core and the ground rail. When the footer is "on" the core operates according to its normal operation. When it is "off" (i.e. during idle mode) the virtual ground rail charges to a voltage level close to the power supply, thus reducing the leakage power consumed. In order not to affect the circuit performance during normal operation of the core, the footer transistor must comprise a strong driver, and thus its ratio W/L must be very large. In practice, instead of using a very large transistor, many small parallel transistors are used as the power switch.

Although the power savings using these power switches shows promise for deep submicron technologies, there remains a need for techniques and designs for additional power savings.

For example, even though the power savings using the power switches are high, the time required for recovering from the idle mode tends to prohibit the use of the power switches during short periods of inactivity. The short periods of inactivity include wake-up time, which is the time required to completely discharge the virtual ground rail.

Thus, there continues to be a need in the art for improved techniques and designs to reduce static power consumption.

BRIEF SUMMARY

Embodiments of the subject invention pertain to the reduction of leakage current in integrated circuits (ICs). According to one embodiment of the invention, a power switching circuit and scheme is provided for reducing the static power of an IC, such as a digital core processor, during periods of inactivity in circuit operation of the IC. Power gating techniques of embodiments of the invention can reduce static power by turning off the cores during both long and short idle periods, significantly reducing power consumption during the periods of inactivity.

Certain embodiments of the invention provide a digitally implemented multiple sleep mode power structure. According to an embodiment, multiple power-gating transistors are provided between the core and the power/ground rail. The multiple power-gating transistors are used to turn on and turn off the cores by connecting the core to the power/ground rail when one of the power-gating transistors is on. The size of a power-gating transistor can be used to control the wake-up time and power consumption during a particular idle period of the core. Each power-gating transistor can have a different size to provide a fine-grain control for power management of the core.

According to one aspect of the invention, one or more power-gating transistors of an embodiment of the invention can be used to turn off the core during relatively short periods of inactivity. In a specific embodiment, a footer (power-gating transistor) and two additional power-gating transistors can be provided between the core and the power/ground rail. The footer is a large transistor (high W/L ratio) or a plurality of small parallel transistors capable of driving the core when the core is in the active mode. When the footer is off, leakage current is suppressed by cutting off the leakage path from the circuit ground (referred to as virtual ground) to the ground rail and the core is in a standby mode. The two additional power-gating transistors provide intermediate sleep/standby modes that allow faster wake-up times for the core as compared to the standby mode of the footer. The additional power-gating transistors can be used during shorter idle times to provide some reduction in power leakage (as compared to keeping the core turned on during periods of inactivity). Accordingly, certain embodiments of the invention provide power savings based on exploiting these short periods of inactivity to further reduce the leakage power consumption.

DETAILED DISCLOSURE

According to embodiments of the invention, a power gating circuit is provided for ICs that supports operation in multiple intermediate sleep modes. For example, four or more operating modes can be supported. The four or more operating modes can include the two classic modes of active and standby and at least two intermediate modes. In a specific embodiment, four operating modes are provided, and can be referred to as Active, Sleep, Dream, and Snore. Of course, additional intermediate modes can be achieved.

Figure 1:
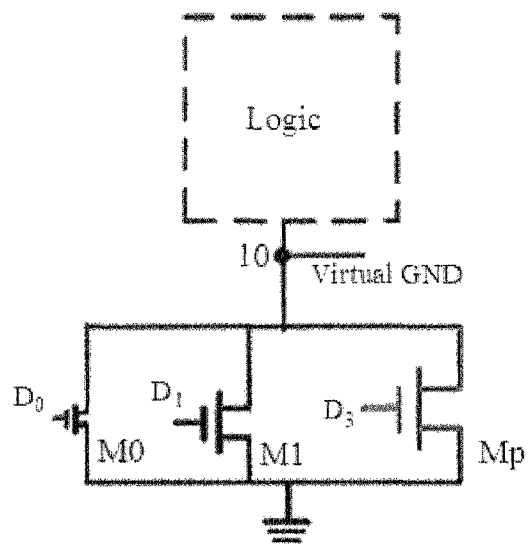
FIG. 1 shows a schematic diagram for a multiple sleep mode power gating circuit according to an embodiment of the invention.

Referring to FIG. 1, a power gating circuit according to an embodiment includes a footer (power switch transistor $M_P$), and two very small transistors $M_0$ and $M_1$. The power switch transistor $M_P$ is a high-Vt transistor that remains on only during the active mode. Although $M_P$ is referred to as a single transistor, it can be fabricated as a plurality of small transistors connected in parallel. According to one operation of the subject power gating architecture, during every instance of time, at most one of the $M_0$, $M_1$, and $M_P$ transistors is on. Of course it is understood that due to switching times, there may be some overlap while one transistor is being turned off and another is being turned off.

Figures 2A, 2B, 2C:
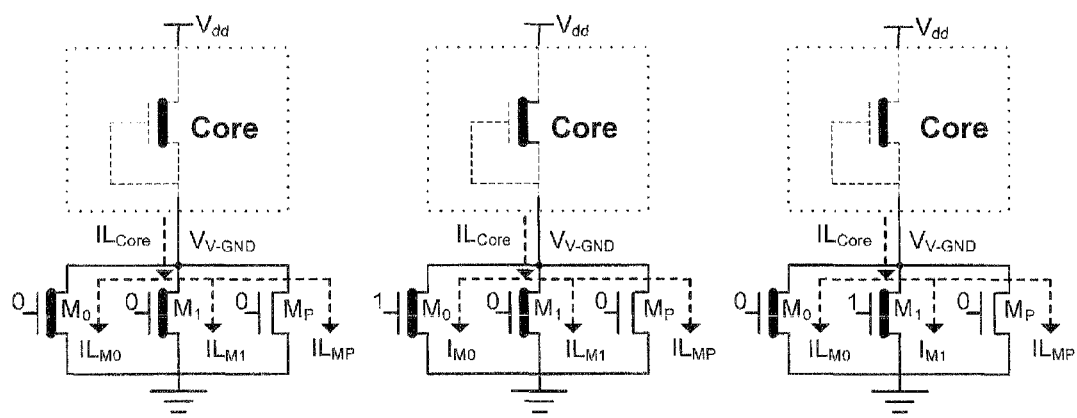
FIGS. 2A-2C illustrate a power gating scheme according to an embodiment of the invention.

FIGS. 2A-2C illustrate a power gating scheme using the circuit of FIG. 1.

When all transistors are off, as shown in FIG. 2A, then the core (or Logic) is in Snore mode (i.e., the core is completely powered down and consumes a minimal amount of energy). In Snore mode, the Virtual ground rail (Virtual GND) is charged to a voltage level close to $V_{DD}$, and thus the wake-up time is very high. The next power mode (similar to "Dream") is achieved by turning on the $M_0$ transistor, which is very small, while keeping the rest of the transistors ($M_1$ and $M_P$) turned off, as shown in FIG. 2B. The size of the $M_0$ transistor is selected in such a way as to partially discharge the Virtual GND node 10, and set a voltage level at this node 10 to be much lower than $V_{DD}$. In that way, the leakage power consumed by the core (or Logic) is increased, but the wake-up time decreases as compared to the case where the core (or Logic) is in Snore mode. In the same way, as shown in FIG. 2C, by turning on the $M_1$ transistor (and having $M_0$ and $M_P$ turned off), the voltage level at Virtual GND node is farther reduced, and thus the wake-up time is further increased (at the expense of power efficiency). Finally, when transistor $M_P$ is on (while keeping $M_0$ and $M_1$ turned off), the circuit is active. Therefore, the transistors function as switches to generate particular sleep modes.

In accordance with an embodiment of the invention, each transistor ($M_0$, $M_1$, and $M_P$) is turned on and off using a corresponding control signal. In a further embodiment, a decoder can be used to reduce the number of control inputs to the power gating circuit to provide the corresponding control signals. In a specific embodiment having the footer $M_P$ and the two additional power-gating transistors (such as shown in FIG. 1) a 2:4 decoder can be used. The 2:4 decoder can also be used for an embodiment having the footer $M_P$ and three additional power-gating transistors.

In certain embodiments, every core in a system on a chip (SoC) can be connected to different footer transistors and respective additional gating transistors.

Figure 3:
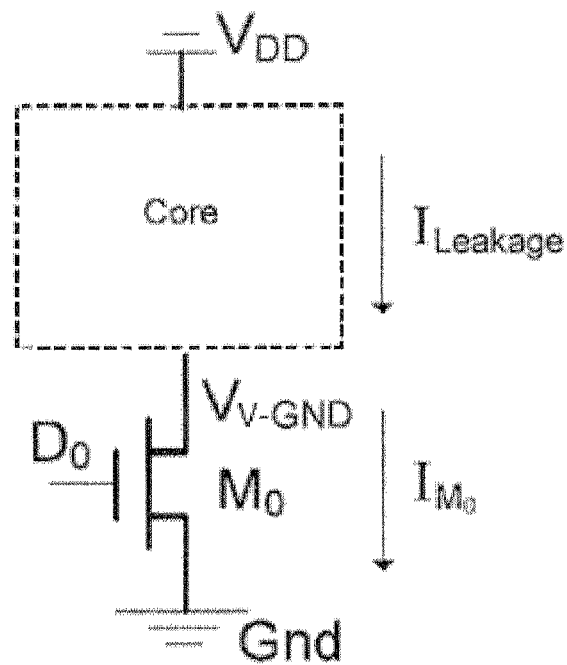
FIG. 3 shows a functional schematic for a multiple sleep mode power gating circuit according to an embodiment of the invention.

According to an embodiment of the invention, the size of the $M_0$ transistor is used to enable partially discharging the Virtual GND node 10 and setting a voltage level at this node 10 to be much lower than $V_{DD}$. For example, a basic operation for Dream mode is shown in the schematic of FIG. 3. As described above, the Dream mode operation is controlled by transistor $M_0$. For the Dream mode operation, transistor $M_0$ is "on" and operates in the linear region (while the other transistors are "off"). Consequently the current flowing through $M_0$, referred to as $I_{M0}$, is approximated by equation (1).

$$I_{M_0} = \mu_n C_{ox} \frac{W_{M_0}}{L_{M_0}} \left( (V_{GS_{M_0}} - V_{th_{M_0}}) V_{DS_{M_0}} - \frac{V_{DS_{M_0}}^2}{2} \right) \quad (1)$$

When transistor $M_0$ is on, $I_{Leakage}=I_{M0}$, where $I_{Leakage}$ is the leakage current flowing through the core. The leakage current flowing through the core can be generally approximated using Ohm's law to $I_{Leakage}=(V_{DD}-V_{V-GND})/R_{core}$, where $R_{core}$ is the equivalent resistance of the core and $V_{v-GND}$ is the voltage at the Virtual GND node 10. Then, because $I_{Leakage}=I_{M0}$, the current flowing through $M_0$ can also be generally approximated as $I_{M0}=(V_{DD}-V_{V-GND})/R_{core}$, resulting in $(V_{DD}-V_{V-GND})=I_{M0} \times R_{core}$. This relation provides a basic equation for the voltage at the virtual ground ($V_{v-GND}$) in terms of the equivalent resistance of the core ($R_{core}$), the leakage current flowing through transistor $M_0$ ($I_{M0}$), and the supply rail ($V_{DD}$), namely $V_{v-GND}=V_{DD}-I_{M0} \times R_{core}$. Therefore, when transistor $M_0$ is on, the voltage at the virtual ground ($V_{V-GND}$) can be approximated by equation (2).

$$V_{V-GND} = V_{DD} - R_{core} \mu_n C_{ox} \frac{W_{M0}}{L_{M0}} \left( (V_{GS_{M0}} - V_{th_{M0}}) V_{DS_{M0}} - \frac{V_{DS_{M0}}^2}{2} \right) \quad (2)$$

As indicated by equation (1), as the ratio $W_{M0}/L_{M0}$ increases, the leakage current (and thus the static power consumption) increases. At the same time, equation (2) shows that as the ratio $W_{M0}/L_{M0}$ increases, the voltage level at virtual ground rail decreases from $V_{DD}$ to 0, and thus the wake-up time decreases too. Therefore, by increasing (decreasing) the ratio $W_{M0}/L_{M0}$ the wake-up time and the power savings is decreased (increased). In addition, the ability to provide short wake-up times from sleep modes can reduce overhead and impact on circuit operation of the core.

One approach to sizing the small transistors that control the intermediate sleep modes is based on approximating the wake-up time outcome. For example, the sub-threshold leakage current of the core ($IL_{core}$) can be calculated using equation (3).

$$IL_{core} = I_0^{core}[1 - e^{(V_{dd} - VV\text{-}GND)/v_t}] \cdot e^{(VV\text{-}GND - V_{dd} - V_{THC} - V_{off})/nv_t} \quad (3)$$

where $I_0^{core}$ is a constant, which depends on the width and length of the equivalent transistor corresponding to the core and on process parameters, n is a slope factor, $v_t$ is the temperature voltage, $V_{off}$ is an off voltage, and $V_{THC}$ is the threshold voltage of the logic circuit of the core. The leakage current of the power switch $M_P$ ($IL_{MP}$) can be calculated using equation (4).

$$IL_{M_P} = I_0^{M_P}[1 - e^{-VV\text{-}GND/v_t}] \cdot e^{V_{TH\text{-}SW} - V_{off}/nv_t} \quad (4)$$

The leakage current of transistor $M_1$ ($IL_{M1}$) can be calculated in the same way as the leakage current of the power switch $M_P$. According to Kirchhoff's current law, the leakage currents can be related as: $IL_{core} = I_{M0} + IL_{M1} + IL_{MP}$. Because $W_{MP}/L_{MP} \gg W_{M1}/L_{M1}$ and thus $IL_{M1} \ll IL_{MP}$, the term $IL_{M1}$ can be neglected and equation (5) can be used to relate the leakage currents.

$$IL_{core} = I_{M0} + IL_{MP} \quad (5)$$

Substituting equations (1), (3), and (4) into equation (5), the size of $M_0$ can be obtained as follows:

$$\frac{W_{M_0}}{L_{M_0}} = \frac{2(IL_{core} - IL_{M_P})}{\mu_n C_{ox}(2(V_{dd} - V_{THC})V_{V\text{-}GND} - V_{V\text{-}GND}^2)} \quad (6)$$

By using Equation (6), the voltage level V-GND can be adjusted to any value in the range $(0, V_{dd} - V_{THC})$ and the aspect ratio of transistor $M_0$ can be calculated. The wake-up time is calculated as follows:

$$T_{wake\text{-}up} = C_{total} \cdot R_{eq}$$

where $C_{total}$ is the parasitic capacitance of the virtual ground and $R_{eq}$ is the equivalent resistance of transistor $M_0$ when it discharges the virtual ground node ($R_{eq}$ is the average resistance of $M_0$ for the conducting time duration). Thus, the wake-up time is provided by the following equation:

$$T_{wake\text{-}up} = C_{total} \cdot R_{eq} = C_{total} \cdot (1/(t_2 - t_1)) \int_{t_1}^{t_2} (V_{v\text{-}GND}(t)/I_D(t)) dt$$

or equivalently $$T_{wake\text{-}up} = C_{total} \times \frac{1}{-V_{V\text{-}GND}} \int_{V\text{-}GND}^{0} \frac{V}{I_D(V)} dV \quad (7)$$

Since $M_0$ is in the linear region during the wake-up operation ($V_{GS} = V_{dd}$), its drain current is given by the following equation:

$$I_{M0} = \mu_n C_{OX} W/L(V_{dd} - V_{THC})V_{Ds} - V_{DS}^2/2)$$

Consequently, equation (7) can be written as follows:

$$T_{wake\text{-}up} = C_{total} \times \frac{-2L}{\mu_n C_{ox} W V_{V\text{-}GND}} \int_{V_{V\text{-}GND}}^{0} \frac{1}{2(V_{dd} - V_{THC}) - V} dV$$

Therefore, the wake-up time can be calculated using the following equation:

$$T_{wake\text{-}up} = \frac{2C_{total}L(\ln(2(V_{dd} - V_{THC})) - \ln(|V_{V\text{-}GND} - 2(V_{dd} - V_{THC})|))}{\mu_n C_{ox} W V_{V\text{-}GND}}. \quad (8)$$

The same analysis as above can be used for calculating the size and the wake-up time of transistor $M_1$; the "Sleep" mode case is presented in FIG. 2C.

In general, equations (6) and (8) can be used for calculating the transistor size required to set the virtual ground rail at any particular voltage level in the range $(0, V_{dd} - V_{THC})$. In the above analysis, only the sub-threshold leakage current is considered for every device that is turned-off. For a more accurate estimation, however, the total leakage current of the core and the power switch $M_P$ would be used in equation (6). The wake-up time also depends on the internal state of the core since leakage current is input-pattern dependent. Average-case analysis as well as worst-case analysis of the core can be used to calculate the leakage current during idle mode. Worst-case analysis assumes that each cell receives the most leaky logic combination at its inputs.

Accordingly, in certain embodiments multiple intermediate modes can be achieved by following the basic transistor equations and providing a corresponding power gate transistor. For the two intermediate modes utilizing the transistors $M_0$ and $M_1$, Dream and Sleep mode operation can be accomplished by selection of the sizes of the two transistors. Specifically, to create the two intermediate modes, the relative sizes of the transistors follow $W_{M0}/L_{M0} < W_{M1}/L_{M1}$. Because fabrication processes often assign a common length $L_{M0} = L_W$ to all of the transistors in a cell, the relative sizes of the transistors $M_0$ and $M_1$ can be controlled by their widths. Therefore, by adjusting the widths of the transistors $M_0$ and $M_1$ (where $W_{M0} < W_{M1}$) multiple power modes can be accomplished.

The "Active" and "Snore" modes can follow the basic power switch architectures related to active and standby; therefore, a more detailed discussion of the Active and Snore modes is omitted.

Figure 4:
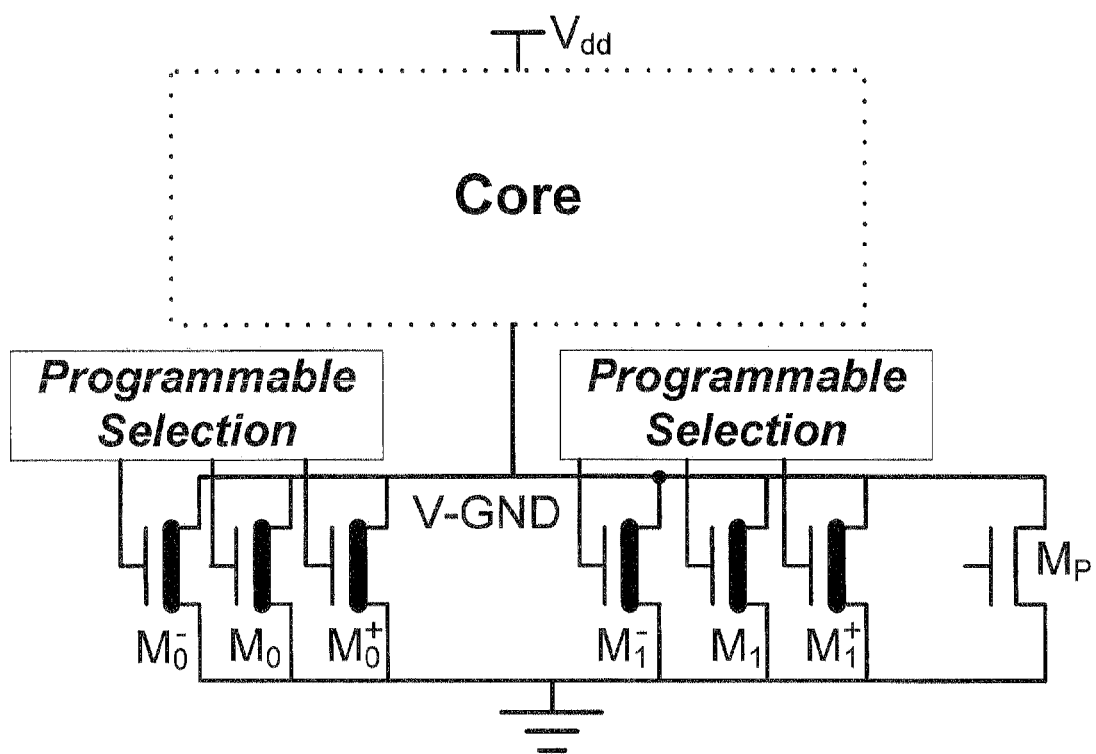
FIG. 4 shows a schematic diagram for a reconfigurable multiple sleep mode power gating circuit according to an embodiment of the invention.

According to a further embodiment of the invention, greater process variations can be tolerated by utilizing a reconfigurable structure such as shown in FIG. 4. As shown in FIG. 4, each of the $M_0$, $M_1$ transistors of the structure described with respect to FIG. 1 is replaced by a triplet of transistors ($M_0^-$, $M_0$, $M_0^+$), ($M_1^-$, $M_1$, $M_1^+$), respectively. The aspect ratios of $M_0$ and $M_1$ are calculated analytically as in the previous subsection. The aspect ratios of ($M_0^-$, $M_0^-$) and ($M_1^-$, $M_1^+$) are selected to be close to the aspect ratio of $M_0$, $M_1$, respectively. Specifically, $W_{M_0'}/L_{M_0'} = (1 + \alpha/100)W_{M_0}/L_{M_0}$, $W_{M_0'}/L_{M_0'} = (1 - \alpha/100)W_{M_0}/L_{M_0}$ where $\alpha \in (0\%, 100\%)$. The parameter a is selected in such a way as to reflect the process variations of the particular technology used. Specifically, it induces an artificial variation in the aspect ratio of these transistors in order to counterbalance some of the process variations. Process variations will shift the desired aspect ratio of transistors $M_0$, $M_1$ a little above or below the nominal value calculated by equation (5). The length of this shift depends on the magnitude of the process variations.

The use of a pair of transistors in each triplet with their aspect ratios already shifted by α% above and below the nominal value increases the probability that one of the transistors of each triplet provides the required voltage at the virtual-ground node in the presence of process variations. For new technologies, which tend to suffer from high process variations, a large value of α is used, whereas for older or mature technologies, a smaller value of a will suffice.

The reconfigurable architecture offers the advantage of low cost due to its simplicity and the small size of transistors $M_0$, $M_1$. Moreover, for even higher tolerance to process variations, the subject reconfigurable structure can be easily extended to accommodate groups of more than three transistors per mode. In such cases, n pairs of transistors with their aspect ratios shifted by $α_1\%, α_2\%, \ldots, α_n\%$ above and below the nominal value of the aspect ratio will be used in each group ($α_1 < α_2 < \ldots < α_n$).

The selection of the proper transistor of each triplet (or larger sized group) can be performed after the manufacturing process using a programmable structure. For example, in one embodiment, fuse technology such as that commonly used for built-in memory self-repair can be used. By using the programmable structure, except for the selected transistor, the other transistors in each triplet (or larger sized group) will be permanently off.

Advantageously, by providing a single transistor switch for each mode of operation for the power gating, the subject power gating circuit operates as a digital device (i.e., a switch). Digital operation of the transistors provides robustness to process variations in the manufacturing process. Reliance on accurate calibration methods can also be reduced. In addition, as described in more detail below, testing of the power-switching circuit can be accomplished using simple testing schemes.

Furthermore, the use of a single digitally-implemented transistor switch for each mode of operation enables a low area overhead.

Moreover, additional sleep modes can be generated simply by adding transistors with particular widths. Therefore, embodiments of the invention are readily expandable.

According to one aspect of the invention, leakage current can be reduced for low power ICs in order to improve battery life of portable electronic devices. According to another aspect of the invention, improved over-all power savings and modes initiating faster wake-up times for core logic can be provided. According to yet another aspect of the invention, multiple wake-up states are provided to allow fine-grained control of the power management policy.

Although the ICs described herein are digital ICs, the power gating architectures and switching schemes of embodiments of the invention are applicable to analog and mixed signal ICs.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE

Fault Testing

Table I presents the sizes (widths W) of the transistors used for simulating an embodiment of the subject architecture according to the circuit shown in FIG. 1, where the lengths of the transistors were all set to 90 nm.

TABLE I

| Gating Transistors (FIG. 1) | |
|---|---|
| $M_0$ | 3.6 μm |
| $M_1$ | 7.2 μm |
| $M_P$ | 43200 μm |

A fault analysis of an example embodiment of the subject architecture was perfoinied. A logic core consisting of 3 million inverters of minimum size (for a 90 nm BSIM4 technology) was used for the simulations. In addition, the clock frequency was set equal to 1 GHz, and the leakage power consumption of the core during idle mode is 7.9088 mW.

To analyze fault effects, catastrophic faults (opens and shorts) are applied to the three-transistor circuit shown in FIG. 1. These three transistors could be either open or short due to manufacturing defects. In the experiments, a single fault is inserted at one time, which means one of the three transistors is either open or short during the simulation. If a transistor is short, a small resistor (10 O) is connected with it in parallel; if a transistor is open, it is removed from the schematic and no current can be passed through it. Simulation results are listed in Table II. The first case provides the fault free case. The second case shows where one of the three transistors is short. In the second case, because the three transistors are in parallel, it is not important to distinguish which transistor is short—the three short cases will create the same fault scenario. The third case is when $M_0$ is open, the fourth case is when $M_1$ is open, and the fifth case is when $M_P$ is open. In the Table II, faulty modes caused by fault insertion are underlined.

TABLE II

| mode | Wake-up time (cycles) | Power consumption (μm) | Virtual ground (V) |
|---|---|---|---|
| (1) Fault free case | | | |
| Sleep | 3 | 5703.4 | 0.243 |
| Dream | 4 | 3734.5 | 0.607 |
| Snore | 5 | 458.6 | 1.199 |
| (2) Any of power switches ($M_0$, $M_1$, $M_P$) short | | | |
| Sleep | 2 | 7404.1 | 0.464 |
| Dream | 3 | 7347.2 | 0.051 |
| Snore | 3 | 7278.2 | 0.058 |
| (3) $M_0$ open | | | |
| Sleep | 3 | 5703.4 | 0.243 |
| Dream | 5 | 458.5 | 1.199 |
| Snore | 5 | 458.5 | 1.199 |
| (4) $M_1$ open | | | |
| Sleep | 5 | 458.5 | 1.119 |
| Dream | 4 | 3734.4 | 0.607 |
| Snore | 5 | 458.5 | 1.199 |
| (4) $M_P$ open | | | |
| Sleep | 11 | 10.9 | 0.258 |
| Dream | 182 | 182 | 0.692 |
| Snore | 283 | 282.7 | 1.22 |

As shown in Table II, the detectable faults affect the wake-up time as well as the Virtual ground voltage. In most cases the wake-up time increases while in some cases the wake-up time decreases (the leakage power increases in that case).

The circuit of FIG. 1 can be easy to test. For example, according to certain embodiments of the invention, the power switching circuit can be tested using digital test vectors. In one embodiment, when the core is equipped with scan chain(s) and a state retention mechanism, then such faults can be detected by applying low slack test vectors. According to a specific embodiment, every selected test vector is first loaded into the scan chains of the core and then the core is put into a sleep mode. Subsequently, the core is reactivated and the test vector is applied at the N cycle (N is the number of cycles required for activating the core after the particular sleep mode). The same process is repeated for applying the test vector at the N−1 cycle. When the response is faulty at the N cycle, it can be deduced that the core has not been completely activated at the expected cycle. In addition, when the response captured at cycle N−1 is correct, it can be deduced that one of the faults that decreases the wake-up time, but at the same time increases the leakage power, has occurred.

Thus, testing the subject power switching circuit can be easily accomplished.

Another way to test these faults is by directly measuring the voltage level on the Virtual ground rail on the tester. Table II shows that the voltage level on the Virtual ground rail suffices to show the existence of the fault. If direct measurement of the voltage level on the Virtual ground rail is not possible or if embedded testing is used, then multi-threshold gates can be driven by the Virtual ground rail. The threshold voltage of each gate is properly selected in order to detect each of the faulty voltage levels at the Virtual ground rail.

EXAMPLE

Performance

As an illustration of the reduction in power consumption and wake-up time by utilizing embodiments of the subject architecture, an example embodiment of the subject architecture is compared to the architecture described by Singh et al. in "Enhanced Leakage Reduction Techniques Using Intermediate Strength Power Gating," IEEE Transactions on VLSI, vol. 15, No. 11, pp. 1215-1224 (November 2007).

TABLE III

| Mp Gate Voltage | Conducting Transistor | Power Mode |
|---|---|---|
| Gnd | $M_2$ | Snore |
| $V_1$ > Gnd | $M_3$ | Dream |
| $V_2$ > $V_1$ | $M_4$ | Sleep |
| VDD | $M_5$ | Active |

For the architecture described by Singh et al., transistor $M_0$ adjusts the gate voltage of $M_P$ at the ground level Gnd, and thus it completely turns off the core (labeled as "Logic"). This is the "Snore" mode, and the leakage power dissipated is minimal. In the "Snore" mode, the voltage level at $V_{GND}$ (virtual ground) is very close to $V_{DD}$ (i.e. to the power supply). Consequently, the wake-up time (i.e. the time required to put the core into the active mode) is very high since it requires the power switch transistor $M_P$ to completely discharge the virtual ground rail. The next two modes, namely "Dream" and "Sleep", are determined by the two sub-threshold gate voltages $V_1$ and $V_2$, which enable the virtual ground to be charged to a lower potential than $V_{DD}$, thereby reducing the wake-up time. However, at the same time, the leakage power consumed during Dream and Sleep increases compared to the "Snore" mode. Finally, by adjusting the gate voltage level to $V_{DD}$ the core is completely turned on (i.e., it is put into "Active" mode).

For the experiments comparing the architecture described by Singh et al. and an embodiment of the subject power switching architecture, a logic core consisting of 3 million inverters of minimum size (for a 90 nm BS1M4 technology) was used for the simulations. In addition, the clock frequency was set equal to 1 GHz, and the leakage power consumption of the core during idle mode is 7.9088 mW. Table IV presents the sizes (widths W) of the transistors used for simulating the architecture of Singh et al., where the lengths of the transistors were all set equal to 90 nm. The sizes (widths W) of the transistors used for simulating the embodiment of the subject architecture according to the circuit shown in FIG. 1 are the same as provided in Table I, where the lengths of the transistors were also all set to 90 nm.

TABLE IV

| Gating Transistors (FIG. 5A) | | Bias Generator for V1 (FIG. 5B) | | | | Bias Generator for V2 (FIG. 5B) | | | |
|---|---|---|---|---|---|---|---|---|---|
| $M_2$ | 6 μm | $M_6$ | 0.24 μm | $M_{10}$ | 0.12 μm | $M_6$ | 0.24 μm | $M_{10}$ | 0.12 μm |
| $M_3$ | 6 μm | $M_7$ | 0.24 μm | $M_{11}$ | 0.12 μm | $M_7$ | 0.24 μm | $M_{11}$ | 0.12 μm |
| $M_4$ | 6 μm | $M_8$ | 0.24 μm | $M_{12}$ | 0.12 μm | $M_8$ | 0.24 μm | $M_{12}$ | 0.12 μm |
| $M_5$ | 12 μm | $M_9$ | 0.12 μm | $M_{13}$ | 0.24 μm | $M_9$ | 0.12 μm | $M_{13}$ | 0.96 μm |
| $M_P$ | | | | | 43200 μm | | | | |

Figure 5A:
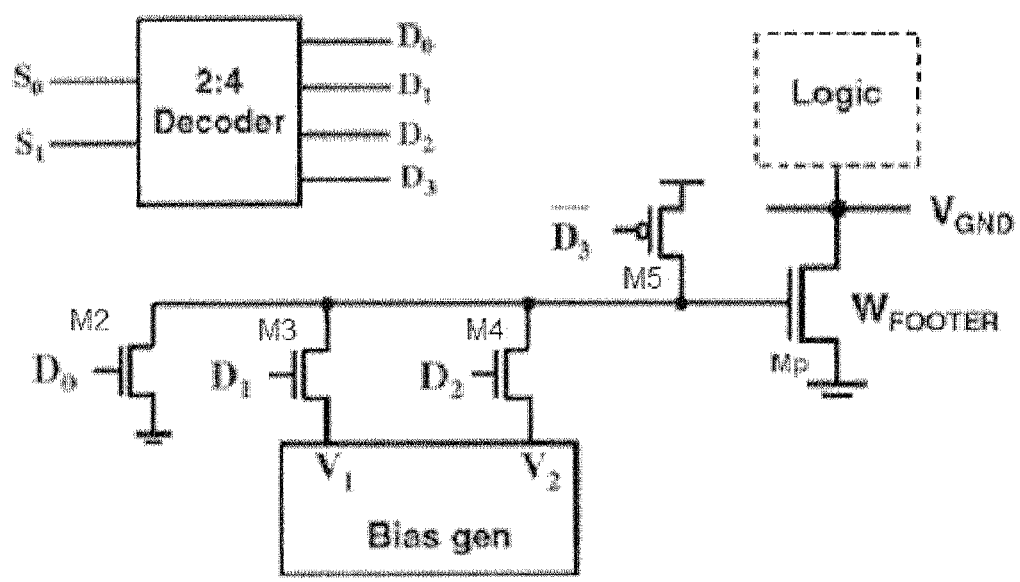
FIG. 5A shows a schematic diagram for a multiple sleep mode power gating circuit according to a prior art.
Figure 5B:
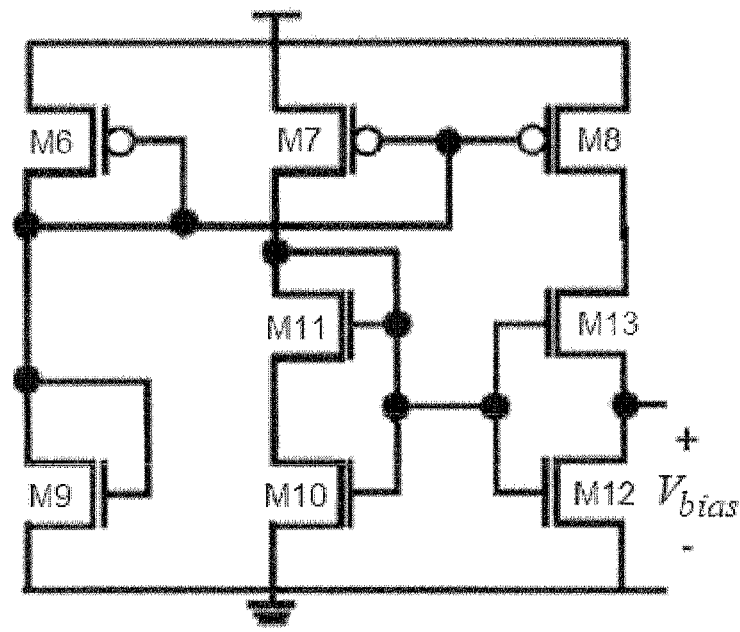
FIG. 5B shows a schematic of a bias generator circuit used with the power gating circuit of FIG. 5A.

FIGS. 5A and 5B show the architecture described by Singh et al. Referring to FIG. 5A, the power switch transistor is represented by transistor $M_P$, which can be the same as the respective power switch $M_P$ of FIG. 1. However, different than the subject invention, the rest of the circuit taught by Singh et al. consists of a bias circuit (as shown in FIG. 5B) and the transistors $M_2$, $M_3$, $M_4$, and $M_5$, which regulate the gate voltage of the power switch. Specifically, the gate voltage of $M_P$ is adjusted to four different voltage levels as shown in Table III. According to Singh et al., by adjusting the gate voltage of the power switch $M_P$ in various sub-threshold voltage levels, the virtual ground voltage can be adjusted in various levels.

For both cases, the size of the basic power switch transistor Mp is the same, as the size of the basic power switch transistor depends only on the core. Additionally one decoder of minimal size was used in each architecture to select the gating transistors. However, since the width of transistor $M_5$ in the architecture of Singh et al. shown in FIG. 5A is large for quickly charging the large gate capacitance of the power switch Mp during activation of the core after any sleep mode, an additional large buffer (i.e. two inverters in series) was inserted between the D3 output of the decoder and the gate of the transistor $M_5$. The sizes of the transistors for the two inverters were 24 μm for the width of the PMOS of each inverter and 12 μm for the width of the NMOS of each inverter. The same large buffer was used for driving the power switch transistor $M_P$ in the simulation of the embodiment of the subject architecture. For the experiment, the transistor sizes were selected in such a way as to provide similar wake-up times in both architectures and thus to provide a fair comparison between them.

From the schematics shown in FIGS. 1, 5A, and 5B and the Tables I and IV, it is apparent that, except for the basic power switch (Mp) (which is similar to both architectures), the embodiment of the subject architecture contains less than one third of the circuitry of the architecture proposed by Singh et al. Furthermore, it is apparent from FIG. 5A and FIG. 1 that the embodiment of the subject architecture is also much simpler than that taught by Singh et al., which results in less routing overhead.

Figure 6:
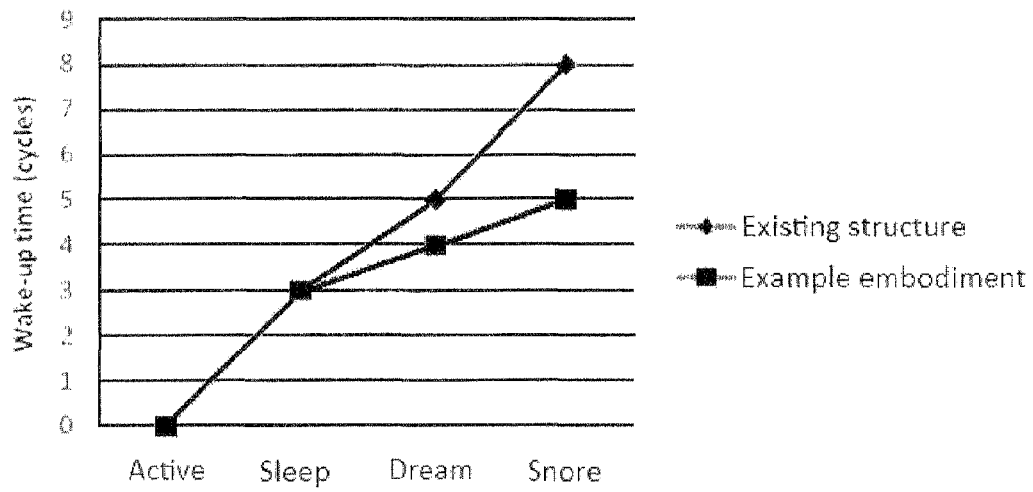
FIG. 6 shows a plot illustrating a wake-up time comparison between a prior art and an embodiment of the invention.
Figure 7:
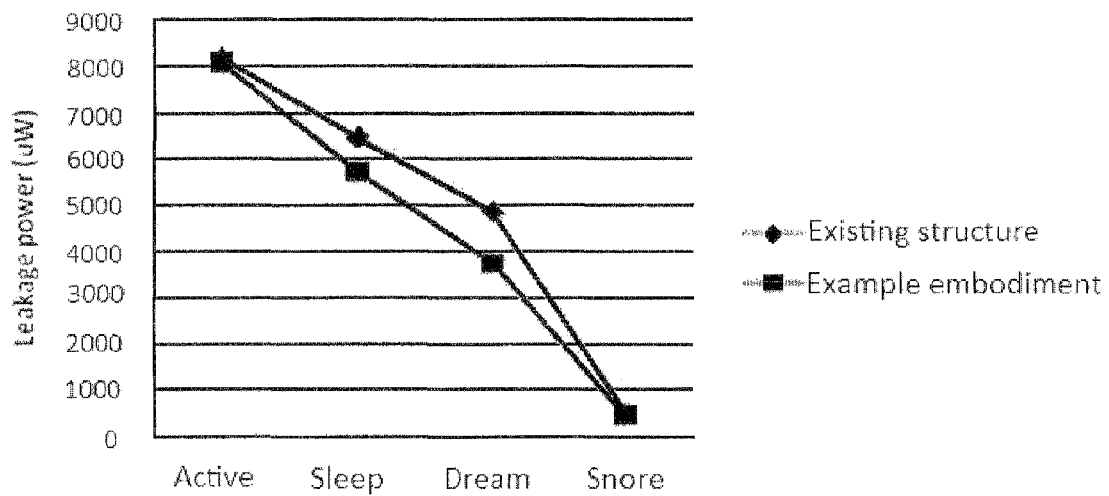
FIG. 7 shows a plot illustrating a leakage power comparison between a prior art and an embodiment of the invention.

The results of the simulations are summarized in Tables V and VI and shown in the plots of FIGS. 6 and 7. Table V shows the wake-up time, power consumption and voltage at the virtual ground rail for the architecture taught by Singh et al., and Table VI shows the wake-up time, power consumption, and voltage at the virtual ground rail for the embodiment of the subject architecture.

TABLE V

Singh et al. Architecture

| mode | Wake-up time (cycles) | Power consumption ($\mu$W) | Virtual ground (V) |
| --- | --- | --- | --- |
| Active | 0 | 8169.1 | $34.63 \times 10^{-6}$ |
| Sleep | 3 | 6442.8 | 0.159 |
| Dream | 5 | 4832 | 0.401 |
| Snore | 8 | 557.2 | 1.199 |

TABLE VI

Example Embodiment of the subject Architecture

| mode | Wake-up time (cycles) | Power consumption ($\mu$W) | Virtual ground (V) |
| --- | --- | --- | --- |
| Active | 0 | 8074.3 | $34.56 \times 10^{-6}$ |
| Sleep | 3 | 5703.4 | 0.243 |
| Dream | 4 | 3734.5 | 0.607 |
| Snore | 5 | 458.6 | 1.199 |

FIG. 6 illustrates the wake-up times of the simulated architecture taught by Singh et al. (noted as "Existing structure") and the embodiment of the subject architecture according to the number of cycles. For these simulations, the cycle time was considered equal to 1 ns. FIG. 6 clearly shows that the embodiment of the subject architecture has faster wake-up times than the architecture of Singh et al. in Dream and Snore modes. FIG. 7 illustrates the static power consumption, including the core, of both architectures during various idle modes. For these simulations, the core inputs are assumed to be stable. As shown in FIG. 7, the embodiment of the subject architecture has better (less) power consumption than Singh et al. for the two intermediate power modes of Sleep and Dream.

As illustrated by the example comparison, even though the method proposed by Singh et al. is very efficient in reducing the leakage power, it has many drawbacks which seriously limit its applicability. First, the architecture of Singh et al. is very sensitive to parameter deviations, which can seriously affect its operation. In particular, the architecture described by Singh et al. exhibits high sensitivity in the two power modes, "Sleep" and "Dream," to parameter deviations during the manufacturing process. Specifically, the two sub-threshold voltages $V_1$ and $V_2$, which are required for these two power modes, are very close to one another. The two sub-threshold voltages $V_1$ and $V_2$ are very difficult to generate due to parameter deviations in the analog bias circuit shown in FIG. 5B, which also makes testing difficult.

Moreover, the architecture described by Singh et al. is not readily extendable to additional power modes. Another disadvantage is that the architecture described by Singh et al. dissipates standby energy (on the top of that dissipated at the core) which reduces the overall efficiency of the structure.

The improved power consumption of this embodiment of the subject architecture can be credited, at least in part, to the simpler and smaller architecture of the embodiment of the invention, which allows a better exploitation of the power switch potential for reducing leakage power.

EXAMPLE

Multiple Intermediate Sleep Modes

Figure 8:
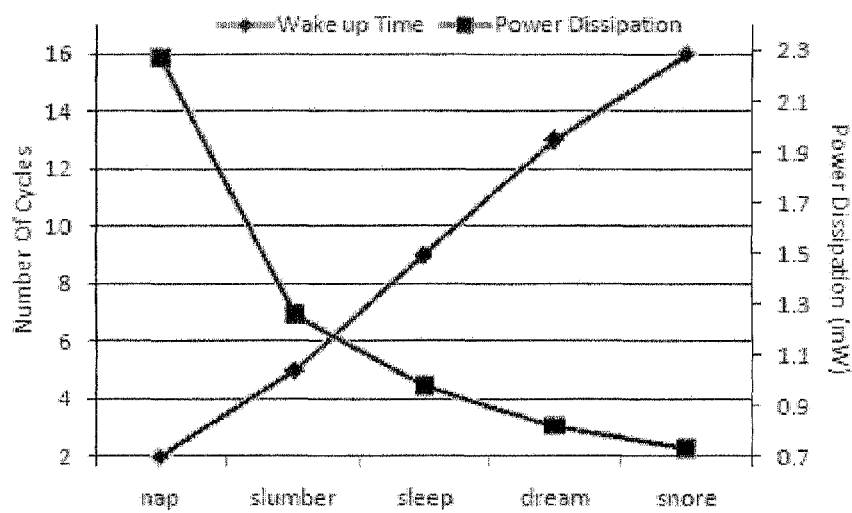
FIG. 8 shows a plot illustrating a wake-up time and power consumption with 5 power modes according to an embodiment of the invention.

An illustration of more than two power-off modes in accordance with an embodiment of the invention is provided. In a first example, four intermediate power-off modes are provided and named dream, sleep, slumber and nap (snore mode is the complete power-off mode). For the four intermediate power-off mode case, a 2 GHz clock frequency was used in the simulations. FIG. 8 presents the tradeoff between wake-up time and power consumption for the four intermediate power-off mode design. The left y-axis in FIG. 8 presents the number of wake-up cycles, while the right y-axis presents the power consumption for each power-off mode. The tradeoff between wake-up time and power reduction can be effectivelly extended to more power-off modes by using embodiments of the subject scheme.

Accordingly, embodiments of the invention provide fine segmentation into power-off modes and greater exploitation of the short periods of inactivity in cases where the wake-up time from the complete power-off mode is large.

Figure 9:
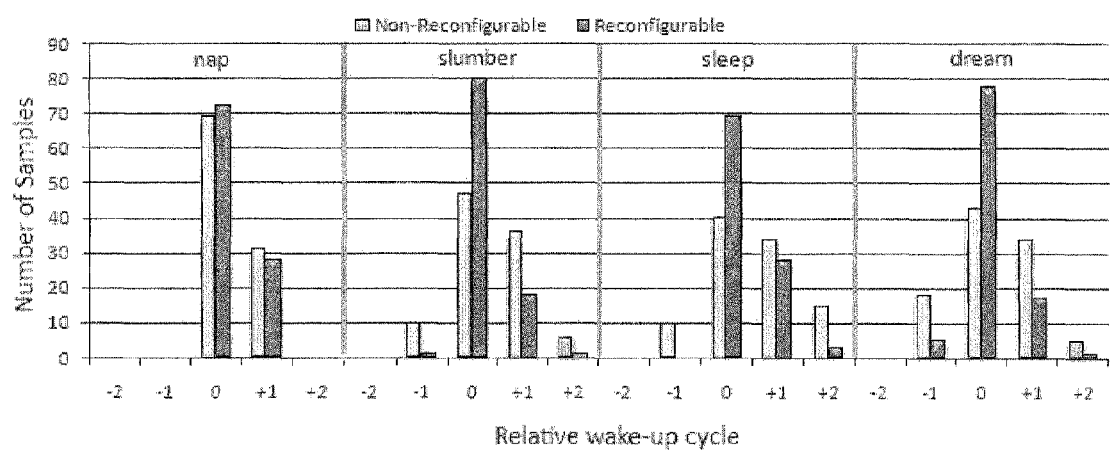
FIG. 9 shows a graph illustrating power consumption for four intermediate modes in accordance with reconfigurable and non-reconfigurable power gating embodiments of the invention.

FIG. 9 illustrates the effectiveness of the reconfigurable architecture for higher levels of process variations. For the experiment, 100 Monte Carlo simulations were ran for both the reconfigurable and non-reconfigurable architecture for five power-off modes, assuming variations of 3.5% for transistor width, 10% for transistor length, 3% for $T_{ox}$, and 30% for threshold voltage (these values are obtained from a current VDSM technology in industry). The reconfigurable architecture was based on the triplets of transistors as in FIG. 4, with $\alpha=5\%$ for dream mode and 10% for the rest of the modes. From each triplet, the transistor was selected that best matched the nominal case in terms of the number of wake-up cycles.

FIG. 9 shows the distribution of the samples with respect to the wake-up cycles for the four intermediate power-off modes for both reconfigurable and non-reconfigurable architecture. For each mode, the number of samples that need the same number of wake-up cycles is presented with the case of no-process variations (denoted as relative wake-up cycle 0 in the chart). Additionally, the number of samples that need one or two more cycles (denoted as relative wake-up cycle '+1', '+2') as well as the number of samples that need one or two less cycles (denoted as relative wake-up cycle '−1', '−2') are presented in the graphs of FIG. 9. From the simulations, it can be seen that the reconfigurable architecture improves tolerance to process variations and offers higher percentage of samples operating as designed, especially in the slumber, sleep and dream modes. In further embodiments, an even higher tolerance can be achieved by using groups of more than three transistors per mode.

Thus, according to embodiments of the invention, instead of consuming power by remaining in the active mode during the short periods of inactivity, the circuit can be put into various sleep modes depending on the wake-up time, as well as on the length of the inactivity period. The longer is the inactivity period, the higher are the power savings and the higher is also the wake-up time required. Therefore, each sleep mode represents a different tradeoff between wake-up overhead and leakage power savings.

All patents, patent applications, provisional applications, and publications referred to or cited herein are incorporated by reference in their entirety, including all figures and tables, to the extent they are not inconsistent with the explicit teachings of this specification.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A power switching circuit, comprising:
   a first power-gating transistor connected between a circuit ground and a ground rail of an IC chip, wherein a gate of the first power-gating transistor receives a first control signal;
   a second power-gating transistor connected in parallel with the first power-gating transistor, wherein a gate of the second power-gating transistor receives a second control signal; and
   a third power-gating transistor connected in parallel with the first power-gating transistor and the second power-gating transistor, wherein a gate of the third power-gating transistor receives a third control signal,
   wherein the first power-gating transistor has a channel width to length ratio greater than that of the second power-gating transistor and the second power-gating transistor has a channel width to length ratio greater than that of the third power-gating transistor.

2. The power switching circuit according to claim 1, wherein the channel width to length ratio of the second power-gating transistor is about a same order of magnitude as the channel width to length ratio of the third power-gating transistor.

3. The power switching circuit according to claim 1, wherein the channel width to length ratio of the third power-gating transistor causes a node at the connection between the third power-gating transistor and the IC chip to partially discharge to a voltage level lower than a power supply rail voltage $V_{DD}$ of the IC chip.

4. The power switching circuit according to claim 1, wherein the first control signal, the second control signal, and the third control signal are selectively provided by a decoder.

5. The power switching circuit according to claim 1, further comprising a fourth power-gating transistor connected in parallel with each of the first, second and third power-gating transistors, wherein a gate of the fourth power-gating transistor receives a fourth control signal.

6. The power switching circuit according to claim 5, wherein the fourth power-gating transistor has a channel width to length ratio different than that of the first, second, and third power-gating transistors.

7. The power switching circuit according to claim 1, further comprising:
   at least one first dummy transistor adjacent the second power-gating transistor and having a channel width to length ratio of about a same size as the second power-gating transistor; and
   at least one second dummy transistor adjacent the third power-gating transistor and having a channel width to length ratio of about a same size as the third power-gating transistor.

8. The power switching circuit according to claim 1, wherein the channel width to length ratio of the first power-gating transistor is orders of magnitude larger than the channel width to length ratio of the second power-gating transistor.

9. A method of fabricating a power switching circuit, the method comprising:
   forming a first power-gating transistor connected between a circuit ground and a ground rail of an IC chip;
   forming a group of second power-gating transistors including:
      a second power-gating transistor connected in parallel with the first power-gating transistor, and
      at least one first dummy transistor adjacent the second power-gating transistor and having a channel width to length ratio of about a same size as the second power-gating transistor;
   forming a group of third power-gating transistors including:
      a third power-gating transistor connected in parallel with the first power-gating transistor and the second power-gating transistor, and
      at least one second dummy transistor adjacent the third power-gating transistor and having a channel width to length ratio of about a same size as the third power-gating transistor;
   selecting one of the group of second power-gating transistors to be the second power gating transistor by blowing fuses of unselected ones of the group of second power-gating transistors; and
   selecting one of the group of third power-gating transistors to be the third power-gating transistor by blowing fuses of unselected ones of the group of third power-gating transistors,
   wherein the unselected ones of the group of second power-gating transistors having the blown fuses form the at least one first dummy transistor,
   wherein the unselected ones of the group of third power-gating transistors having the blown fuses form the at least one second dummy transistor,
   wherein the first power-gating transistor has a channel width to length ratio greater than that of the second power-gating transistor and the second power-gating transistor has a channel width to length ratio greater than that of the third power-gating transistor.

10. The method of fabricating according to claim 9, wherein one transistor of the group of second power-gating transistors is designed with a channel length to width ratio of $W_2/L_2$ and two transistors of the group of second power-gating transistors are designed with a channel length to width ratio of $W_{2+}/L_{2+}=(1+\alpha/100)(W_2/L_2)$ and $W_{2-}/L_{2-}=(1-\alpha/100)(W_2/L_2)$, respectively, where $\alpha\in(0\%, 100\%)$; and wherein one transistor of the group of third power-gating transistors is designed with a channel length to width ratio of $W_3/L_3$, and two transistors of the group of third power-gating transistors are designed with a channel length to width ratio of $W_{3+}/L_{3+}=(1+\alpha/100)(W_3/L_3)$ and $W_{3-}/L_{3-}=(1-\alpha/100)(W_3/L_3)$, respectively.

11. The method of fabricating according to claim 10, wherein another two transistors of the group of second power-gating transistors are designed with a channel length to width ratio of $W_{2++}/L_{2++}=(1+\beta/100)(W_2/L_2)$ and $W_{2--}/L_{2--}=(1-\beta/100)(W_2/L_2)$, respectively, where $\beta\in(0\%, 100\%)$ and $\beta>\alpha$; and wherein another two transistors of the group of third power-gating transistors are designed with a channel length to width ratio of $W_{3++}/L_{3++}=(1+\beta/100)(W_3/L_3)$ and $W_{3--}/L_{3--}=(1-\beta/100)(W_3/L_3)$, respectively.

12. The method according to claim 9, wherein the channel width to length ratio of the first power-gating transistor is orders of magnitude larger than the channel width to length ratio of the second power-gating transistor.

13. A method of power-gating using a power switching circuit, the method comprising:

implementing an active mode for an IC chip by applying a first control signal to a first power-gating transistor connected between a circuit ground and a ground rail of the IC chip to turn on the first power-gating transistor, wherein during the active mode, a second power-gating transistor that is connected in parallel with the first power-gating transistor and a third power-gating transistor that is connected in parallel with the first power-gating transistor and the second power transistor are turned off using a second control signal and a third control signal, respectively, wherein the first power-gating transistor has a channel width to length ratio greater than that of the second power-gating transistor and the second power-gating transistor has a channel width to length ratio greater than that of the third power-gating transistor;

implementing a first sleep mode for the IC chip by applying the second control signal to the second power-gating transistor to turn on the second power-gating transistor, wherein the first and third power-gating transistors are turned off using the first and third control signals;

implementing a second sleep mode for the IC chip by applying the third control signal to the third power-gating transistor to turn on the third power-gating transistor, wherein the first and second power-gating transistors are turned off using the first and second control signals;

implementing a third sleep mode for the IC chip by applying the first, second, and third control signals to the first, second, and third power-gating transistors to turn off the first, second, and third power-gating transistors.

14. The method according to claim 13, wherein the first sleep mode is implemented during short idle periods of the IC chip.

15. The method according to claim 14, wherein the short idle periods comprise periods where the IC chip is idle for between 3 and 8 cycles.

16. The method according to claim 15, wherein the second sleep mode is implemented for periods where the IC chip is idle for between 5 and 8 cycles, wherein the third sleep mode is implemented for periods where the IC chip is idle for more than 8 cycles.

17. The method according to claim 13, wherein the power switching circuit further comprises a fourth power-gating transistor connected in parallel with each of the first, second and third power-gating transistors, wherein a gate of the fourth power-gating transistor receives a fourth control signal, the method further comprising:

implementing a fourth sleep mode for the IC chip by applying the fourth control signal to the second power-gating transistor to turn on the fourth power-gating transistor, wherein the first, second, and third power-gating transistors are turned off using the first, second, and third control signals, wherein the fourth power-gating transistor is turned off using the fourth control signal during the active mode, the first sleep mode, the second sleep mode, and the third sleep mode.

18. The method according to claim 13, wherein the channel width to length ratio of the first power-gating transistor is orders of magnitude larger than the channel width to length ratio of the second power-gating transistor and the channel width to length ratio of the second power-gating transistor is about a same order of magnitude as the channel width to length ratio of the third power-gating transistor.

19. The method according to claim 13, wherein the channel width to length ratio of the third power-gating transistor causes a node at the connection between the third power-gating transistor and the IC chip to partially discharge to a voltage level lower than a power supply rail voltage $V_{DD}$ of the IC chip.

20. The method circuit according to claim 13, wherein the first control signal, the second control signal, and the third control signal are selectively provided by a decoder.

* * * * *

UNITED STATES PATENT AND TRADEMARK OFFICE
CERTIFICATE OF CORRECTION

PATENT NO. : 8,373,493 B2
APPLICATION NO. : 12/882776
DATED : February 12, 2013
INVENTOR(S) : Chakrabarty et al.

It is certified that error appears in the above-identified patent and that said Letters Patent is hereby corrected as shown below:

In the Specification

Column 4,
Line 10, "node is farther" should read --node is further--.

Column 5,
Line 47, "$T_{wake-up}C_{total} \cdot R_{eq}$" should read --$T_{wake-up} = C_{total} \cdot R_{eq}$--.

Line 54, "$(1/(t_2-t_1))\int_{t1}^{t2}$" should read -- $(1/(t_2-t_1))\int_{t1}^{t2}$ --.

Column 6,
Line 41, "$L_{M0} = L_W$" should read --$L_{M0} = L_{M1}$--.

Line 58, "$(M_0^-, M_0^-)$" should read -- $(M_0^-, M_0^+)$ --.

Column 8,
Line 13, "was perfoinied." should read --was performed.--.

Signed and Sealed this
Twenty-sixth Day of November, 2013

Margaret A. Focarino
*Commissioner for Patents of the United States Patent and Trademark Office*

Column 8,
Lines 37-62, Table

TABLE II

| mode | Wake-up time (cycles) | Power consumption (µm) | Virtual ground (V) |
|---|---|---|---|
| (1) Fault free case | | | |
| Sleep | 3 | 5703.4 | 0.243 |
| Dream | 4 | 3734.5 | 0.607 |
| Snore | 5 | 458.6 | 1.199 |
| (2) Any of power switches ($M_0$, $M_1$, $M_P$) short | | | |
| Sleep | 2 | 7404.1 | 0.464 |
| Dream | 3 | 7347.2 | 0.051 |
| Snore | 3 | 7278.2 | 0.058 |
| (3) $M_0$ open | | | |
| Sleep | 3 | 5703.4 | 0.243 |
| Dream | 5 | 458.5 | 1.199 |
| Snore | 5 | 458.5 | 1.199 |
| (4) $M_1$ open | | | |
| Sleep | 5 | 458.5 | 1.119 |
| Dream | 4 | 3734.4 | 0.607 |
| Snore | 5 | 458.5 | 1.199 |
| (4) $M_P$ open | | | |
| Sleep | 11 | 10.9 | 0.258 |
| Dream | 182 | 182 | 0.692 |
| Snore | 283 | 282.7 | 1.22 |

" ―――――――――――――――――――――― "

should read

TABLE II

| mode | Wake-up time (cycles) | Power consumption (μm) | Virtual ground (V) |
|---|---|---|---|
| (1) Fault free case | | | |
| Sleep | 3 | 5703.4 | 0.243 |
| Dream | 4 | 3734.5 | 0.607 |
| Snore | 5 | 458.6 | 1.199 |
| (2) Any of power switches ($M_0$, $M_1$, $M_P$) short | | | |
| Sleep | 2 | 7404.1 | 0.464 |
| Dream | 3 | 7347.2 | 0.051 |
| Snore | 3 | 7278.2 | 0.058 |
| (3) $M_0$ open | | | |
| Sleep | 3 | 5703.4 | 0.243 |
| Dream | 5 | 458.5 | 1.199 |
| Snore | 5 | 458.5 | 1.199 |
| (4) $M_1$ open | | | |
| Sleep | 5 | 458.5 | 1.119 |
| Dream | 4 | 3734.4 | 0.607 |
| Snore | 5 | 458.5 | 1.199 |
| (4) $M_P$ open | | | |
| Sleep | 11 | 10.9 | 0.258 |
| Dream | 182 | 182 | 0.692 |
| Snore | 283 | 282.7 | 1.22 |

In the Claims

Column 15,
Line 19, "$W_{3++/L3++}$" should read --$W_{3++}/L_{3++}$--.
Line 20, "$W_{3--/L3--}$" should read --$W_{3--}/L_{3--}$--.